United States Patent
Taha et al.

(10) Patent No.: US 9,547,361 B2
(45) Date of Patent: Jan. 17, 2017

(54) METHODS AND APPARATUSES FOR MEMORY POWER REDUCTION

(71) Applicant: QUALCOMM Incorporated, San Diego, CA (US)

(72) Inventors: Ali Taha, San Diego, CA (US); Dexter Tamio Chun, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 56 days.

(21) Appl. No.: 14/700,017

(22) Filed: Apr. 29, 2015

(65) Prior Publication Data

US 2016/0320826 A1    Nov. 3, 2016

(51) Int. Cl.
G06F 1/32      (2006.01)
G11C 11/40     (2006.01)
G11C 14/00     (2006.01)
G11C 11/406    (2006.01)

(52) U.S. Cl.
CPC .......... *G06F 1/3275* (2013.01); *G06F 1/3287* (2013.01); *G11C 11/406* (2013.01); *G11C 14/0009* (2013.01); *G11C 14/0054* (2013.01); *G06F 2212/1028* (2013.01); *G06F 2212/205* (2013.01)

(58) Field of Classification Search
CPC .... G06F 1/3275; G06F 1/3287; G11C 11/406; G11C 14/0009; G11C 14/0054
See application file for complete search history.

(56) References Cited

U.S. PATENT DOCUMENTS

| 8,482,992 | B2* | 7/2013 | Huang ............... G11C 7/222 365/149 |
| 8,635,511 | B2* | 1/2014 | Takeuchi ............ G06F 1/3203 714/759 |
| 8,805,457 | B2  | 8/2014 | Sarker |
| 9,361,968 | B2* | 6/2016 | Davis ............... G11C 11/40615 |
| 2011/0231595 | A1 | 9/2011 | Wakrat et al. |
| 2011/0320150 | A1 | 12/2011 | David et al. |
| 2012/0117304 | A1 | 5/2012 | Worthington et al. |
| 2012/0137055 | A1 | 5/2012 | Lee et al. |

(Continued)

FOREIGN PATENT DOCUMENTS

EP    2911056 A1    8/2015
WO    2014059613 A1    4/2014

OTHER PUBLICATIONS

International Search Report and Written Opinion—PCT/US2016/024569—ISA/EPO—Jun. 29, 2016.

*Primary Examiner* — Stefan Stoynov
(74) *Attorney, Agent, or Firm* — Arent Fox LLP

(57) ABSTRACT

Methods and apparatuses for memory power reduction are provided. The apparatus determines whether to store data into a DRAM or an NVRAM during an idle state of a processor based on power consumption by the DRAM in association with refreshing the data in the DRAM and use of the data stored in the DRAM by the processor, based on power consumption by the NVRAM in association with use of the data stored in the NVRAM by the processor, and based on a duty cycle associated with current drawn in a first power state and a second power state in association with the data. The NVRAM is a type of non-volatile random-access memory other than flash memory. The processor stores the data into one of the DRAM or the NVRAM based on the determination whether to store the data in the DRAM or the NVRAM.

43 Claims, 7 Drawing Sheets

(56) References Cited

U.S. PATENT DOCUMENTS

| | | |
|---|---|---|
| 2014/0047251 A1 | 2/2014 | Kottilingal et al. |
| 2014/0181558 A1 | 6/2014 | Taha et al. |
| 2014/0189198 A1 | 7/2014 | Siddiqi et al. |
| 2014/0325249 A1 | 10/2014 | Toyotaka |
| 2015/0106582 A1 | 4/2015 | Mai et al. |
| 2015/0279464 A1* | 10/2015 | Herhut ............... G06F 12/0238 711/103 |

* cited by examiner

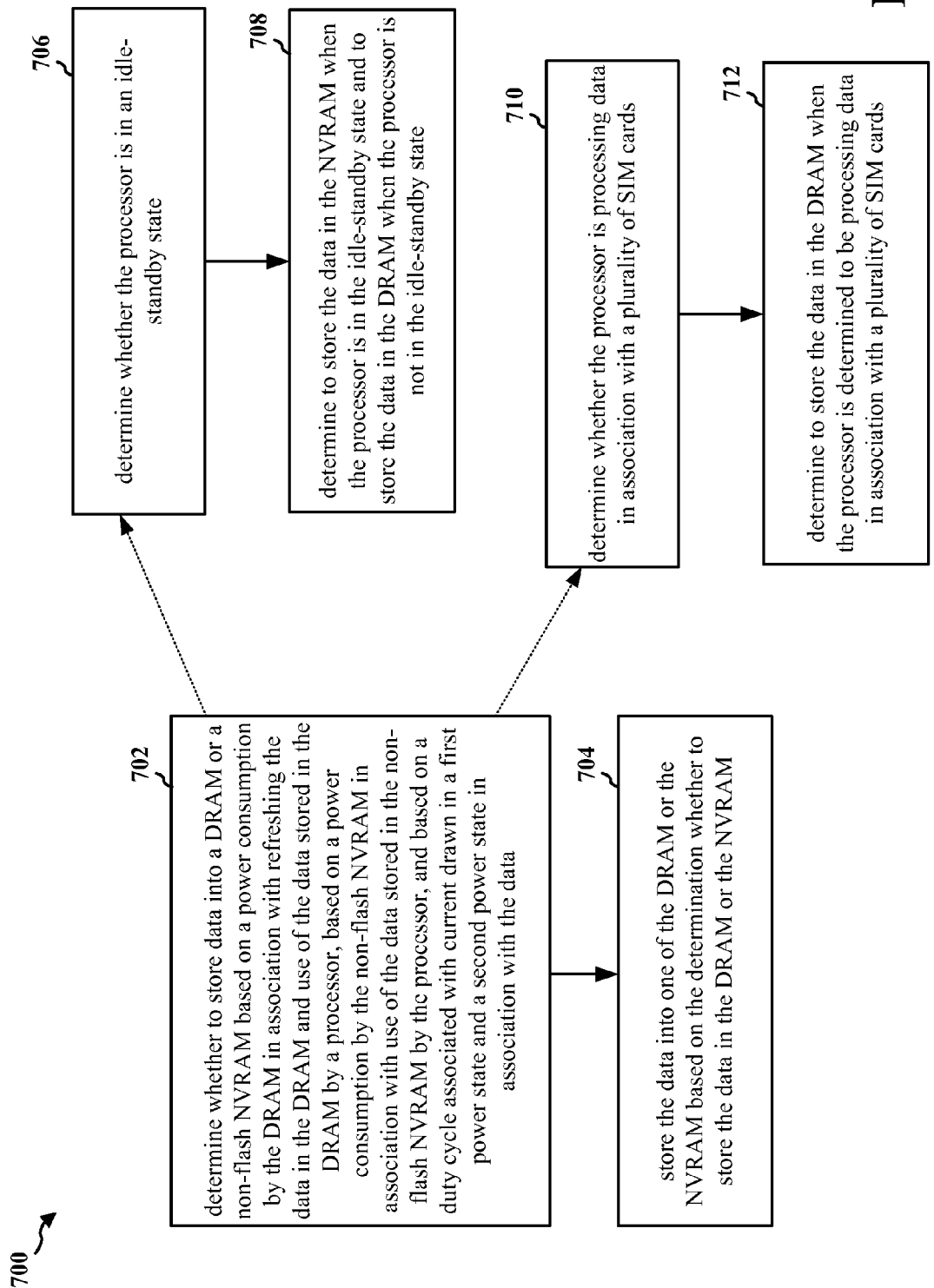

METHODS AND APPARATUSES FOR MEMORY POWER REDUCTION

BACKGROUND

Field

The present disclosure relates generally to power reduction, and more particularly, to memory power reduction.

Background

Dynamic random access memory (DRAM) is a volatile memory that consumes power even when inactive because stored information must be refreshed periodically. Non-volatile random access memory (NVRAM) such as magnetoresistive random-access memory (MRAM), phase-change random-access memory (PRAM), resistive random-access memory (RRAM), ferroelectric random-access memory (FeRAM), or nano-random-access memory (NRAM) consumes less power than DRAM when inactive, but more power than DRAM when active. Methods and apparatus are needed in association with DRAM and NVRAM with respect to power reduction within a system on a chip (SoC)/integrated circuit (IC) that utilizes such memory elements.

SUMMARY

In an aspect of the disclosure, a method of and an apparatus for memory power reduction is provided. The apparatus determines whether to store data into a DRAM or an NVRAM during an idle state of a processor based on a power consumption by the DRAM in association with refreshing the data in the DRAM and use of the data stored in the DRAM by the processor, based on a power consumption by the NVRAM in association with use of the data stored in the NVRAM by the processor, and based on a duty cycle associated with current drawn in a first power state and a second power state in association with the data. The NVRAM is a type of random-access memory other than flash memory. The processor stores the data into one of the DRAM or the NVRAM based on the determination whether to store the data in the DRAM or the NVRAM. The apparatus may be a controller/processor separate from the processor or may be the processor.

BRIEF DESCRIPTION OF THE DRAWINGS

FIG. 7 is a diagram with flow charts of a fourth set of exemplary methods for memory power reduction.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Figure 1:
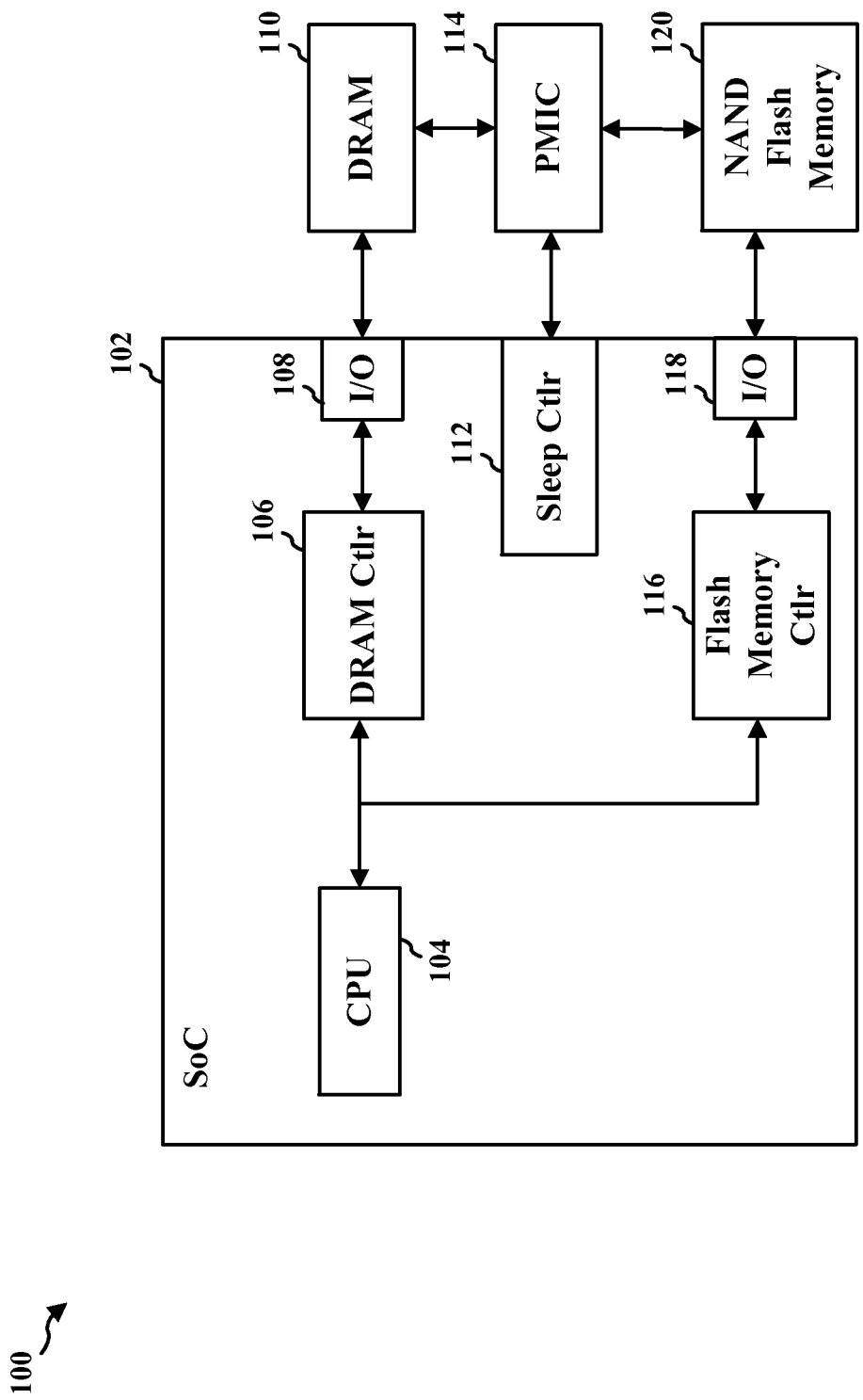
FIG. 1 is a diagram illustrating an SoC with various memory elements.

FIG. 1 is a diagram 100 illustrating an SoC with various memory elements. As shown in FIG. 1, an SoC 102 includes a CPU 104, which interfaces with a DRAM controller 106 and a flash memory controller 116. The DRAM controller 106, through the input/output interface 108, communicates with a DRAM 110. The flash memory controller 116, through the input/output interface 118, communicates with NAND flash memory 120. The SoC 102 further includes a sleep controller 112 that communicates with a power management IC (PMIC) 114. The PMIC 114 manages power provided to the DRAM 110 and the NAND flash memory 120.

During an inactive/sleep state of the CPU 104, the input/output interface 108, the DRAM 110, PMIC 114, and sleep controller 112 consume power due to refreshing data stored in the DRAM 110. Using non-flash memory NVRAM rather than DRAM for storing some data can reduce power consumed by the memory elements during a low power state (e.g., inactive state, idle state, idle-standby state, sleep state) of the CPU 104 in association with such data.

Figure 2:
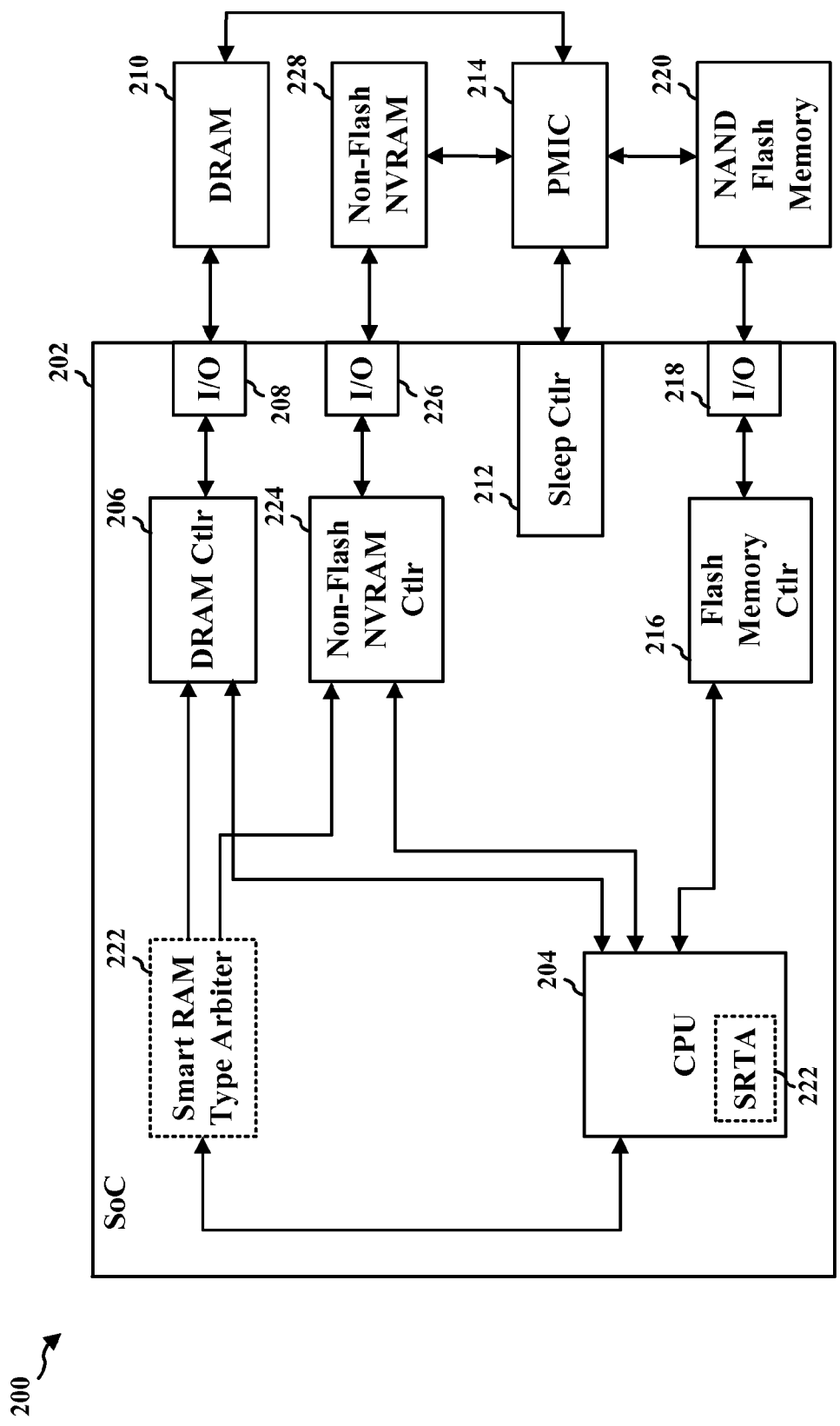
FIG. 2 is a diagram illustrating an exemplary apparatus for memory power reduction.

FIG. 2 is a diagram 200 illustrating an exemplary apparatus for memory power reduction. As shown in FIG. 2, an SoC 202 (also referred to as an SoC IC) includes a CPU 204, which interfaces with a DRAM controller 206, a flash memory controller 216, and a non-flash NVRAM controller 224. The DRAM controller 206, through the input/output interface 208, communicates with a DRAM 210. The flash memory controller 216, through the input/output interface 218, communicates with NAND flash memory 220. The non-flash NVRAM controller 224, through the input/output interface 226, communicates with non-flash NVRAM 228. The non-flash NVRAM 228 may be one of MRAM, PRAM, RRAM, FeRAM, or NRAM. The SoC 202 further includes a sleep controller 212 that communicates with a PMIC 214. The PMIC 214 manages power provided to the DRAM 210, the NAND flash memory 220, and the non-flash NVRAM 228. The SoC 202 further includes a smart RAM type arbiter (SRTA) 222 that interfaces with the DRAM controller 206 and the non-flash NVRAM controller 224. In one configuration, the SRTA 222 is separate from the CPU 204 and interfaces with the CPU 204. In another configuration, the SRTA 222 is a module within the CPU 204 or is the CPU 204. The SRTA 222 is configured to determine whether to store data into the DRAM 210 or the non-flash NVRAM 228 based on a power consumption by the DRAM 210 in association with refreshing the data in the DRAM 210 and use of the data stored in the DRAM 210 by the CPU 204, based on a power consumption by the non-flash NVRAM 228 in association with use of the data stored in the non-flash NVRAM 228 by the CPU 204, and based on a duty cycle associated with current drawn in a first power state and a second power state in association with the data. The first power state may be a high power state and the second power state may be a low power state. Further, the SRTA 222 is configured to store the data into one of the DRAM 210 or the non-flash NVRAM 228 based on the determination whether to store the data in the DRAM 210 or the non-flash NVRAM 228. The SRTA 222 may load/store the data into the DRAM 210 or the non-flash NVRAM 228 from the flash memory 220. Alternatively, the SRTA 222 may move data from one memory to another, and therefore data stored in the DRAM 210 may be moved from the non-flash NVRAM 228, and data stored in the non-flash NVRAM 228 may be moved from the DRAM 210. Although the DRAM 210, the non-flash NVRAM 228, the PMIC 214, and the flash memory 220 are not illustrated on the SoC 202, one or more of the DRAM 210, the non-flash NVRAM 228, the PMIC 214, and the flash memory 220 may be resident on the SoC 202. For example, in one configuration, the SoC 202 also includes the DRAM 210, the non-flash NVRAM 228, and the flash memory 220. Further discussion in association with determining whether to store data in the DRAM 210 or the non-flash NVRAM 228 is provided infra with respect to FIG. 3 and FIG. 4.

Figure 3:
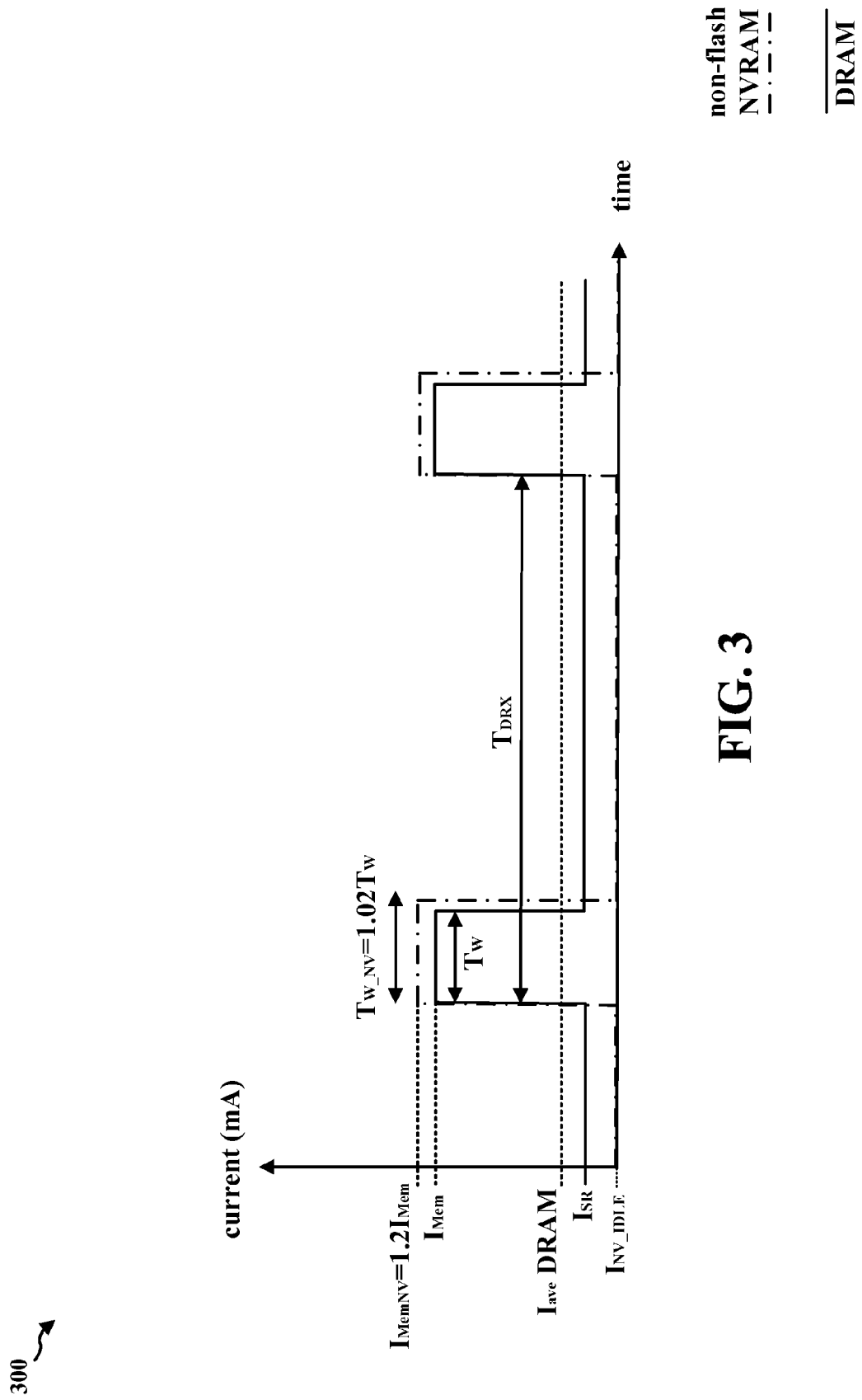
FIG. 3 is a diagram illustrating DRAM and non-flash NVRAM current consumption during different associated power states.

FIG. 3 is a diagram 300 illustrating DRAM and non-flash NVRAM current consumption during different associated power states. Based on the current draw profile of FIG. 3, the average current consumption for the DRAM $I_{ave\_DRAM}$ during period $T_{DRX}$ is equal to $$[(T_{DRX}-T_W)I_{SR}+T_W I_{Mem}]/T_{DRX}, \quad (Eq.\ 1)$$

and the average current consumption for the non-flash NVRAM $I_{ave\_NVRAM}$ during period $T_{DRX}$ is equal to $$[(T_{DRX}-T_{W\_NV})I_{NV\_IDLE}+T_{W\_NV}I_{MemNV}]/T_{DRX}, \quad (Eq.\ 2)$$

which equals $1.224 T_W I_{Mem}/T_{DRX}$ (Eq. 3), assuming $I_{MemNV}=1.2 I_{Mem}$, $T_{W\_NV}=1.02 T_W$, and $I_{NV\_IDLE}=0$. Currently, non-flash NVRAM may consume 15%-20% more current than DRAM during active power states. Further, non-flash NVRAM may have a write latency of about 20% greater than DRAM, resulting in approximately a 2% increase in an active memory timeline for such transactions. Accordingly, the above equations assume that non-flash NVRAM consumes 20% more current than DRAM during active power states, and that active power states for non-flash NVRAM are 2% longer than for DRAM. The equation Eq. 3 changes if the assumptions change. At the same voltage V, power consumption (V*I) holds the same relationship. In one configuration, the SRTA 222 may be configured to store data in the non-flash NVRAM when (in association with use of the data) the average current consumption for non-flash NVRAM $I_{ave\_NVRAM}$ is less than the average current consumption for DRAM $I_{ave\_DRAM}$, and is configured to store the data in DRAM when (in association with use of the data) the average current consumption for non-flash NVRAM $I_{ave\_NVRAM}$ is greater than the average current consumption for DRAM $I_{ave\_DRAM}$. The average current consumption for DRAM $I_{ave\_DRAM}$ is less than the average current consumption for non-flash NVRAM $I_{ave\_NVRAM}$ when $I_{Mem}/I_{SR}>[1-D_{CD}]/[0.224 D_{CN}]$, where $D_{CD}$ is the duty cycle for the DRAM, or when $I_{Mem}/I_{SR}>[1-0.98 D_{CN}]/[0.22 D_{CN}]$, where $D_{CN}$ is the duty cycle for the non-flash NVRAM. Defining K equal to $[1-D_{CD}]/[0.224 D_{CD}]$, the SRTA 222 may be configured to store data in the DRAM when $I_{Mem}>KI_{SR}$, and to store the data in the non-flash NVRAM when $I_{Mem}<KI_{SR}$. Alternatively, K may be defined with respect to the duty cycle of the non-flash NVRAM, and the SRTA 222 may be configured to store the data in the DRAM or non-flash NVRAM based on such defined K. When $I_{Mem}=KI_{SR}$, the SRTA 222 may be configured to store the data in either the DRAM or the non-flash NVRAM. In one configuration, when $I_{Mem}=KI_{SR}$, the SRTA 222 may be configured to store the data in the DRAM. In another configuration, when $I_{Mem}=KI_{SR}$, the SRTA 222 may be configured to store the data in either the DRAM or the non-flash NVRAM based on other factors, such as the likelihood in the future that the current profile in association with the data will change such that more average current will be drawn by the DRAM or the non-flash NVRAM.

As discussed supra, with reference to FIG. 2 and FIG. 3, the SRTA 222 may determine whether to store data into a DRAM 210 or a non-flash NVRAM 228 based on a power consumption by the DRAM 210 in association with refreshing the data in the DRAM 210 and use of the data stored in the DRAM 210 by the CPU 204, based on a power consumption by the non-flash NVRAM 228 in association with use of the data stored in the non-flash NVRAM 228 by the CPU 204, and based on a duty cycle associated with current drawn in a first power state and a second power state in association with the data. The first power state may be a high power state and the second power state may be a low power state. The first power state is during the time period $T_W$ of the time period $T_{DRX}$ for the DRAM, and is during the time period $1.02 T_W$ of the time period $T_{DRX}$ for the non-flash NVRAM. The second power state is the remaining time period of the time period $T_{DRX}$ in which the DRAM/non-flash NVRAM is in an idle/sleep state. The duty cycle may be a duty cycle $D_{CD}$ of the DRAM 210 or a duty cycle $D_{CN}$ of the non-flash NVRAM 228. Accordingly, the SRTA 222 may determine whether to store data into the DRAM 210 or non-flash NVRAM 228 based on $I_{ave\_DRAM}$ and $I_{ave\_NVRAM}$, and $D_{CD}$ and/or $D_{CN}$. Subsequently, the SRTA 222 may store the data into one of the DRAM 210 or the non-flash NVRAM 228 based on the determination whether to store the data in the DRAM 210 or the non-flash NVRAM 228. The SRTA 222 may be a controller/processor separate from the CPU 204, may be a module within the CPU 204, or may be the CPU 204.

In one configuration, the SRTA 222 may determine whether to store data in the DRAM or the non-flash NVRAM based on a determined average current drawn by the DRAM $I_{ave\_DRAM}$ in association with the data or a determined average current drawn by the NVRAM $I_{ave\_NVRAM}$ in association with the data. Specifically, the SRTA 222 may determine the aforementioned K value based on the duty cycle $D_{CD}$ or $D_{CN}$ associated with the data, and based on the determined K value, determine whether the DRAM consumes more power or the non-flash NVRAM consumes more power in association with the data. For example, as discussed supra, the SRTA 222 may be configured to store data in the DRAM when $I_{Mem}>KI_{SR}$, and to store the data in the non-flash NVRAM when $I_{Mem}<KI_{SR}$. Generally, the SRTA 222 may determine whether the DRAM or the non-flash NVRAM consumes more power in association with the data based on at least one of a determined first-power-state current $I_{Mem}$ drawn by the DRAM during the first power state of the processor in association with the data, a determined second-power-state current $I_{SR}$ drawn by the DRAM during the second power state of the processor in association with the data, the duty cycle $D_{CD}$ associated with current drawn in the first power state and the second power state by the DRAM in association with the data, a determined first-power-state current $I_{MemNV}$ (assumed to be $1.2 I_{Mem}$ for Eq. 3) drawn by the non-flash NVRAM during the first power state of the processor in association with the data, a determined second-power-state current $I_{NV\_IDLE}$ (assumed to be approximately zero for Eq. 3) drawn by the NVRAM during the second power state of the processor in association with the data, and the duty cycle $D_{CN}$ associated with current drawn in the first power state and the second power state by the NVRAM in association with the data.

In one configuration, to determine whether to store the data in the DRAM or the non-flash NVRAM, the SRTA 222 may determine a use case for the data in which the use case indicates a duty cycle $D_{CD}$ and/or $D_{CN}$ associated with the data, or an average consumed current $I_{ave\_DRAM}$ and $I_{ave\_NVRAM}$ for the data. Upon determining the use case, the SRTA 222 may access a lookup table associated with use cases to determine whether to store the data in the non-flash NVRAM or the DRAM based on the determined use case. For example, if the data is associated with music (which may have a relatively low duty cycle), the SRTA 222 may determine based on the lookup table that the data should be stored in the non-flash NVRAM, and if the data is associated with a video game (which may have a relatively high duty cycle), the SRTA 222 may determine based on the lookup table that the data should be stored in the DRAM.

When the SRTA 222 determines that a use case is not included in the lookup table, the SRTA 222 may determine whether the use case consumes more or less power in the DRAM or the non-flash NVRAM, and list the use case in the lookup table with information indicating whether the DRAM or the non-flash NVRAM should be used in association with the use case. When determining whether to store the data in the DRAM or the non-flash NVRAM, the SRTA 222 make such determination upon an initial booting of the CPU. For example, for data that is normally loaded into DRAM upon an initial booting of the CPU, the SRTA 222 may determine that a subset of the data based on use cases and the lookup table should be stored in the non-flash NVRAM instead of the DRAM. Subsequently, the SRTA 222 may use different methods to determine whether to store data in the DRAM or non-flash NVRAM.

If the SRTA 222 does not have access to a lookup table, or if the SRTA 222 cannot find a use case in the lookup table, the SRTA 222 may perform a trial measurement to determine whether the DRAM or the non-flash NVRAM consumes more power for a set of data. For example, the SRTA 222 may initially store the data into the DRAM, and determine a DRAM power consumption in the DRAM in association with the data based on information from embedded current sensors that facilitate real-time memory current monitoring. Upon determining that the CPU has been in an idle-standby state with respect to the data for longer than a threshold time period (e.g., $D_{CD}$ is less than a threshold such that $T_{DRX}-T_W$ is greater than the threshold time period), the SRTA 222 may move the data from the DRAM to the non-flash NVRAM. Thereafter, the SRTA 222 may determine an NVRAM power consumption in the non-flash NVRAM in association with the data. Subsequently, the SRTA 222 may determine to keep the data stored in the non-flash NVRAM when the NVRAM power consumption is less than the DRAM power consumption, and may determine to move the data back to the DRAM when the non-flash NVRAM power consumption is greater than the DRAM power consumption. Alternatively or in addition, the SRTA 222 may generate a new use case in the lookup table indicating that such data should be stored in one of the DRAM or the non-flash NVRAM, depending on which had lower power consumption in association with the data.

In one configuration, to determine whether to store the data in the DRAM or the non-flash NVRAM, the SRTA 222 may determine whether the CPU is in an idle-standby state or is not in an idle-standby state. The SRTA 222 may then determine to store the data in the non-flash NVRAM when the CPU is in an idle-standby state and to store the data in the DRAM when the CPU is not in an idle-standby state. For example, when a UE is not in use and the UE is in an idle-standby state, the SRTA 222 may determine to store data in the non-flash NVRAM. If the data is already stored in the DRAM, the SRTA 222 may move such data to the non-flash NVRAM upon determining that the UE is in an idle-standby state.

In one configuration, when a UE utilizes two or more subscriber identity module (SIM) cards (i.e., dual SIM cards), the SRTA 222 may determine to store data in the DRAM, and when a UE utilizes only one SIM cards, the SRTA 222 may determine to store data in the non-flash NVRAM. When a UE utilizes two or more SIM cards, some data may be accessed more frequently by the two or more SIM cards. As such, memory elements that store such data may have a relatively higher duty cycle. With a relatively higher duty cycle in association with data, the SRTA 222 may determine that such data should be stored in the DRAM rather than the non-flash NVRAM.

Figure 4:
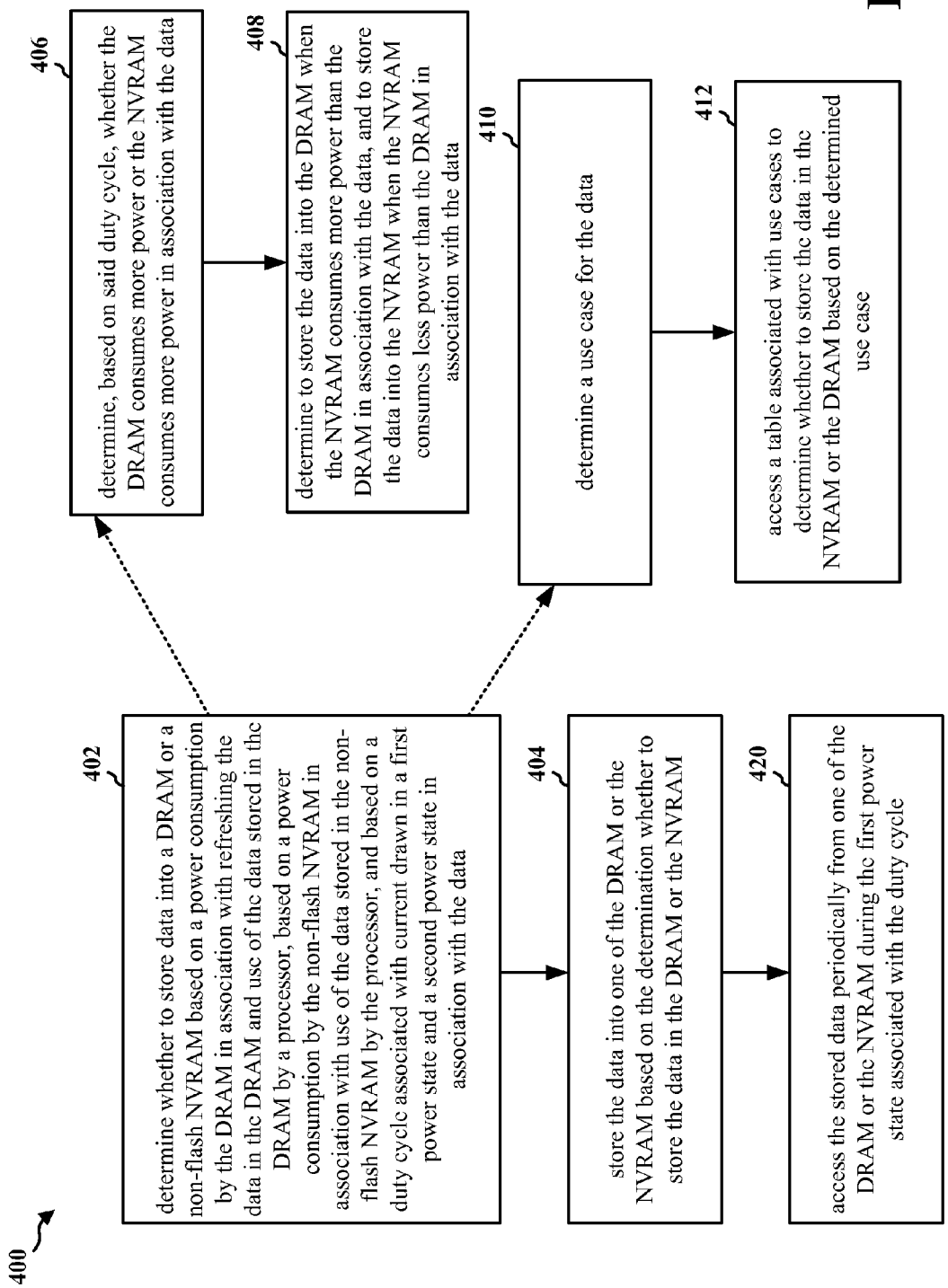
FIG. 4 is a diagram with flow charts of a first set of exemplary methods for memory power reduction.

FIG. 4 is a diagram with flow charts 400 of a first set of exemplary methods for memory power reduction. The method may be performed by an apparatus, such as the SRTA 222. The SRTA 222 may be a controller/processor separate from the CPU 204, a module within the CPU 204, or the CPU 204. At 402, the apparatus for memory power reduction determines whether to store data into a DRAM or a non-flash NVRAM based on a power consumption by the DRAM in association with refreshing the data in the DRAM and use of the data stored in the DRAM by a processor, based on a power consumption by the non-flash NVRAM in association with use of the data stored in the non-flash NVRAM by the processor, and based on a duty cycle associated with current drawn in a first power state and a second power state in association with the data. As discussed supra, the non-flash NVRAM is a type of random-access memory other than flash memory. With respect to 402, the apparatus for memory power reduction determines whether to store data into a DRAM or a non-flash NVRAM based on a power consumption associated with the DRAM/non-flash NVRAM. In a first configuration, the power consumption may be an estimated power consumption, not an actual power consumption. In such a configuration, the apparatus for memory power reduction may estimate the power consumption based on a duty cycle associated with the data. In a second configuration, the power consumption may be an actual power consumption. In such a configuration, the apparatus for memory power reduction may store the data in the DRAM and/or non-flash NVRAM and access the data in order to determine the actual power consumption associated with storing/accessing the data. At 404, the apparatus stores the data into one of the DRAM or the non-flash NVRAM based on the determination whether to store the data in the DRAM or the non-flash NVRAM.

In one configuration, to determine whether to store the data in the DRAM or the non-flash NVRAM (at 402), at 406, the apparatus may determine, based on the duty cycle, whether the DRAM consumes more power or the non-flash NVRAM consumes more power in association with the data. In addition, at 408, the apparatus may determine to store the data into the DRAM when the non-flash NVRAM consumes more power than the DRAM in association with the data, and to store the data into the non-flash NVRAM when the non-flash NVRAM consumes less power than the DRAM in association with the data.

In one configuration, the determination whether the DRAM or the non-flash NVRAM consumes more power in association with the data is further based on at least one of a determined average current drawn by the DRAM in association with the data or a determined average current drawn by the non-flash NVRAM in association with the data. In one configuration, the determination whether the DRAM or the non-flash NVRAM consumes more power in association with the data is further based on at least one of a determined first-power-state current drawn by the DRAM during the first power state of the processor in association with the data, a determined second-power-state current drawn by the DRAM during the second power state of the processor in association with the data, the duty cycle associated with current drawn in the first power state and the second power state by the DRAM in association with the data, a determined first-power-state current drawn by the non-flash NVRAM during the first power state of the processor in association with the data, a determined second-power-state current drawn by the non-flash NVRAM during the second power state of the processor in association with the data, and the duty cycle associated with current drawn in the first power state and the second power state by the non-flash NVRAM in association with the data.

In one configuration, to determine whether to store the data in the DRAM or the non-flash NVRAM (at 402), at 410, the apparatus may determine a use case for the data, and at 412, the apparatus may access a table associated with use cases to determine whether to store the data in the non-flash NVRAM or the DRAM based on the determined use case.

In one configuration, at 420, the apparatus may access the stored data periodically from one of the DRAM or the NVRAM during the first power state associated with the duty cycle. For example, with reference to FIG. 3, assume that the apparatus determines to store a set of data into a DRAM. Assume also that the DRAM has a current profile as shown in FIG. 3 when the set of data within the DRAM is accessed/refreshed. As such, within the DRAM, $I_{Mem}$ current is consumed in association with the set of data during the time period $T_W$ of the first power state of the time period $T_{DRX}$, and $I_{SR}$ current is consumed in association with the set of data during a remaining time period of the second power state (e.g., idle/sleep state) of the time period $T_{DRX}$. The average current consumed at 420 is less than what the average current consumed would be had the set of data been stored in the non-flash NVRAM, as the apparatus previously determined (e.g., through estimation) that the DRAM would consume less current in association with accessing/refreshing the set of data than the non-flash NVRAM in association with accessing the set of data. For another example, with reference to FIG. 3, assume that the apparatus determines to store a set of data into a non-flash NVRAM. Assume also that the non-flash NVRAM has a current profile as shown in FIG. 3 when the set of data within the non-flash NVRAM is accessed. As such, within the non-flash NVRAM, $1.2I_{Mem}$ current is consumed in association with the set of data during the time period $1.02T_W$ of the first power state of the time period $T_{DRX}$, and $I_{NV\_IDLE}$ current is consumed in association with the set of data during a remaining time period of the second power state (e.g., idle/sleep state) of the time period $T_{DRX}$. The average current consumed at 420 is less than what the average current consumed would be had the set of data been stored in the DRAM, as the apparatus previously determined (e.g., through estimation) that the non-flash NVRAM would consume less current in association with accessing the set of data than the DRAM in association with accessing/refreshing the set of data.

The DRAM/non-flash NVRAM may have a current profile as shown in FIG. 3 when the apparatus accesses the set of data within the DRAM/non-flash NVRAM periodically during a first time period (e.g., during the first power state) and when the apparatus does not access the set of data periodically during a second time period (e.g., during the second power state). For example, the set of data may be a music file. The apparatus may access the DRAM/non-flash NVRAM periodically to read a portion of the music file resulting in a higher current consumed by the DRAM/non-flash NVRAM during the time of access. During times when the apparatus is not accessing the music file in the DRAM/non-flash NVRAM, a lower current may be consumed by the DRAM/non-flash NVRAM.

Figure 5:
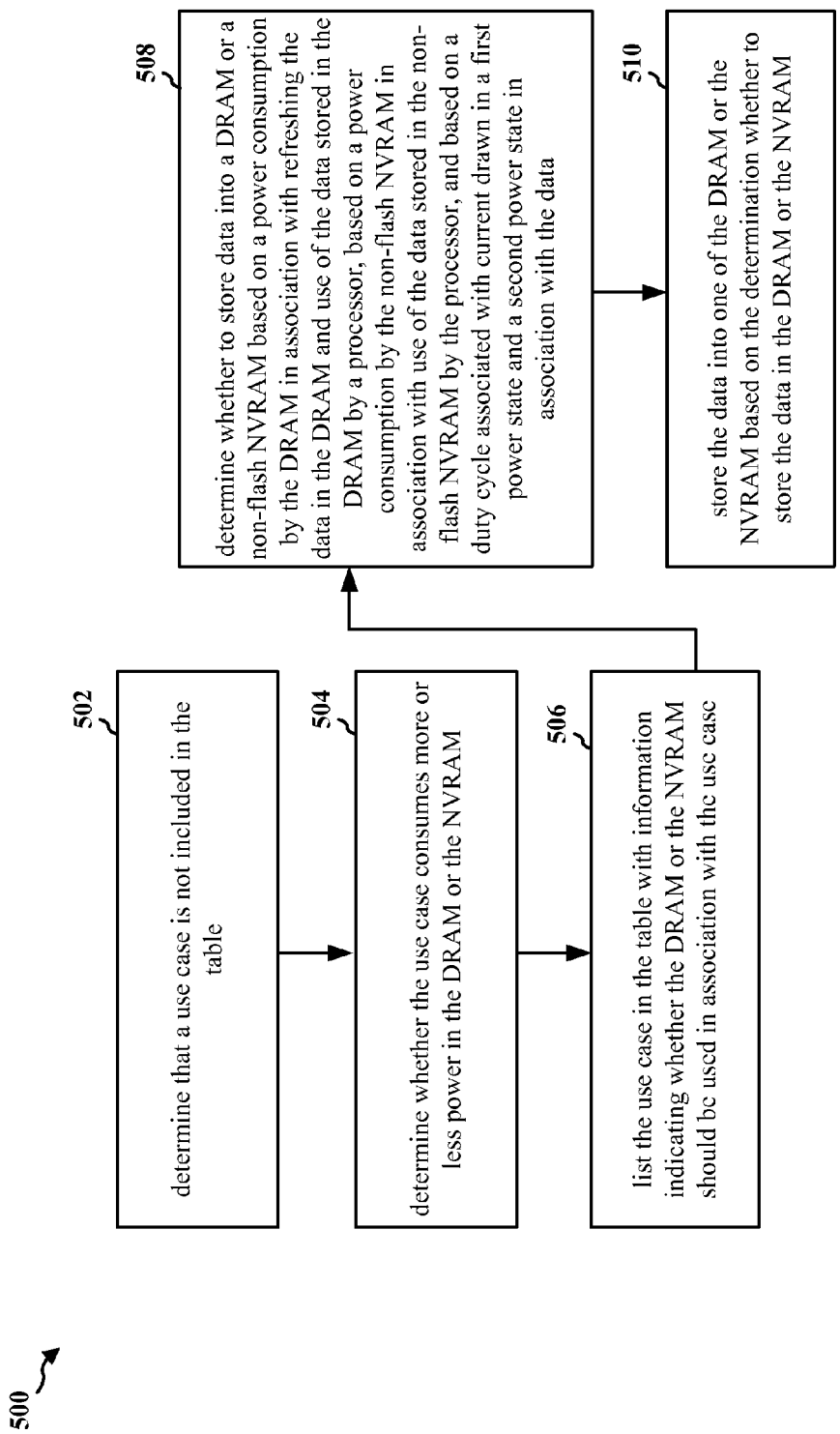
FIG. 5 is a diagram with flow charts of a second set of exemplary methods for memory power reduction.

FIG. 5 is a diagram with flow charts 500 of a second set of exemplary methods for memory power reduction. The method may be performed by an apparatus, such as the SRTA 222. The SRTA 222 may be a controller/processor separate from the CPU 204, a module within the CPU 204, or the CPU 204. At 502, the apparatus determines that a use case is not included in the table. At 504, the apparatus determines whether the use case consumes more or less power in the DRAM or the non-flash NVRAM. At 506, the apparatus lists the use case in the table with information indicating whether the DRAM or the non-flash NVRAM should be used in association with the use case. At 508, the apparatus determines whether to store data into a DRAM or a non-flash NVRAM based on a power consumption by the DRAM in association with refreshing the data in the DRAM and use of the data stored in the DRAM by a processor, based on a power consumption by the non-flash NVRAM in association with use of the data stored in the non-flash NVRAM by the processor, and based on a duty cycle associated with current drawn in a first power state and a second power state in association with the data. The apparatus may perform 508 by performing 410 and 412. At 510, the apparatus stores the data into one of the DRAM or the non-flash NVRAM based on the determination whether to store the data in the DRAM or the non-flash NVRAM. In one configuration, the determination whether to store the data in the DRAM or the non-flash NVRAM occurs upon an initial booting of the processor.

Figure 6:
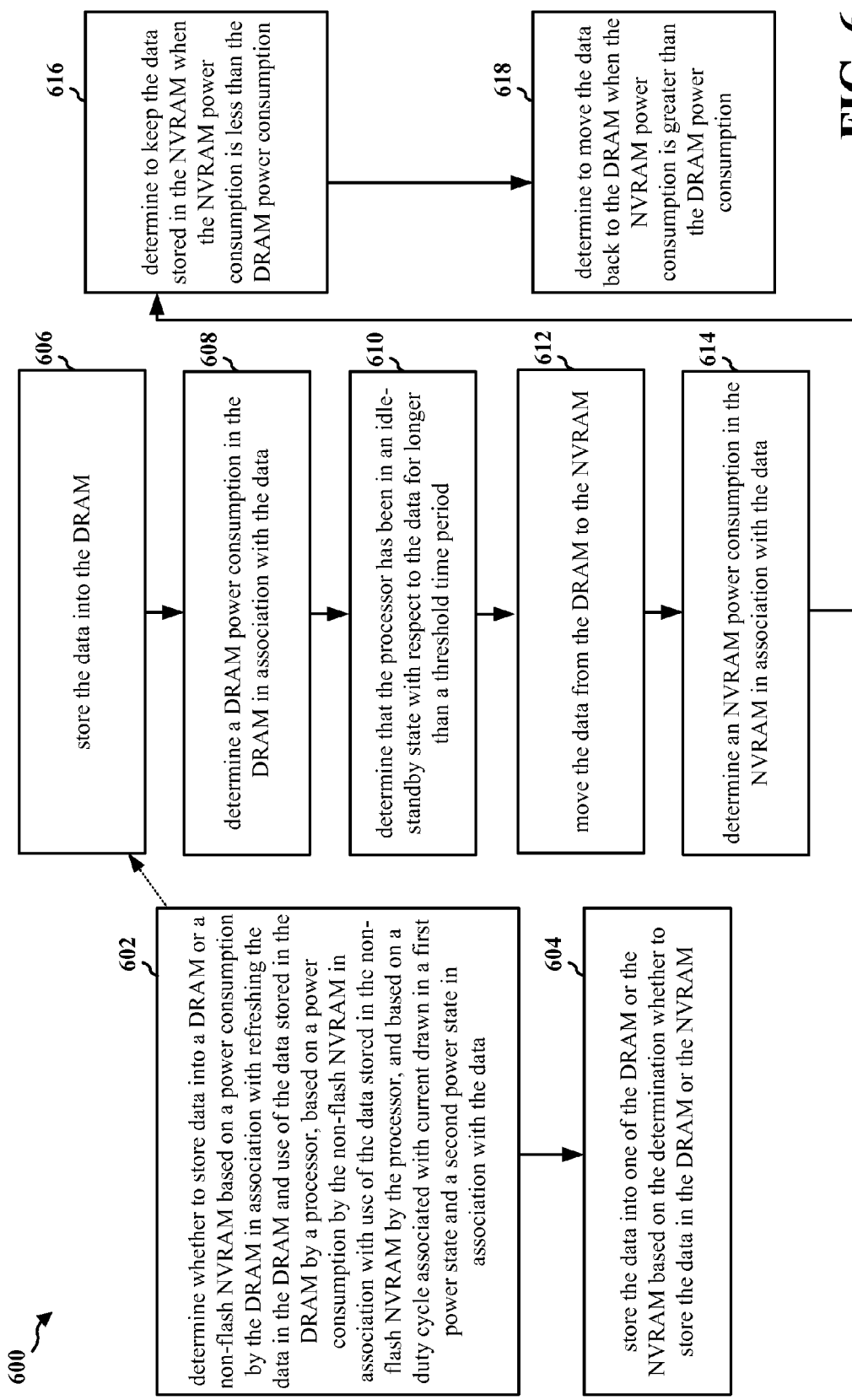
FIG. 6 is a diagram with flow charts of a third set of exemplary methods for memory power reduction.

FIG. 6 is a diagram with flow charts 600 of a third set of exemplary methods for memory power reduction. The method may be performed by an apparatus, such as the SRTA 222. The SRTA 222 may be a controller/processor separate from the CPU 204, a module within the CPU 204, or the CPU 204. At 602, the apparatus for memory power reduction determines whether to store data into a DRAM or a non-flash NVRAM based on a power consumption by the DRAM in association with refreshing the data in the DRAM and use of the data stored in the DRAM by a processor, based on a power consumption by the non-flash NVRAM in association with use of the data stored in the non-flash NVRAM by the processor, and based on a duty cycle associated with current drawn in a first power state and a second power state in association with the data. At 604, the apparatus stores the data into one of the DRAM or the non-flash NVRAM based on the determination whether to store the data in the DRAM or the non-flash NVRAM.

To determination whether to store the data in the DRAM or the non-flash NVRAM (at 602), at 606, the apparatus may store the data into the DRAM. In addition, at 608, the apparatus may determine a DRAM power consumption in the DRAM in association with the data. In addition, at 610, the apparatus may determine that the processor has been in an idle-standby state with respect to the data for longer than a threshold time period. In addition, at 612, the apparatus may move the data from the DRAM to the non-flash NVRAM. In addition, at 614, the apparatus may determine an NVRAM power consumption in the non-flash NVRAM in association with the data. In addition, at 616, the apparatus may determine to keep the data stored in the non-flash NVRAM when the NVRAM power consumption is less than the DRAM power consumption. Further, at 618, the apparatus may determine to move the data back to the DRAM when the NVRAM power consumption is greater than the DRAM power consumption.

FIG. 7 is a diagram with flow charts 700 of a fourth set of exemplary methods for memory power reduction. The method may be performed by an apparatus, such as the SRTA 222. The SRTA 222 may be a controller/processor separate from the CPU 204, a module within the CPU 204, or the CPU 204. At 702, the apparatus for memory power reduction determines whether to store data into a DRAM or a non-flash NVRAM based on a power consumption by the DRAM in association with refreshing the data in the DRAM and use of the data stored in the DRAM by a processor, based on a power consumption by the non-flash NVRAM in association with use of the data stored in the non-flash NVRAM by the processor, and based on a duty cycle associated with current drawn in a first power state and a second power state in association with the data. At 704, the apparatus stores the data into one of the DRAM or the non-flash NVRAM based on the determination whether to store the data in the DRAM or the non-flash NVRAM.

In one configuration, to determination whether to store the data in the DRAM or the non-flash NVRAM (at 702), at 706, the apparatus may determine whether the processor is in an idle-standby state, and at 708, the apparatus may determine to store the data in the non-flash NVRAM when the processor is in the idle-standby state and to store the data in the DRAM when the processor is not in the idle-standby state.

In one configuration, to determination whether to store the data in the DRAM or the non-flash NVRAM (at 702), at 710, the apparatus may determine whether the processor is processing data in association with a plurality of SIM cards, and at 712, the apparatus may determine to store the data in the DRAM when the processor is determined to be processing data in association with a plurality of SIM cards.

In one configuration, at 404, 510, 604, and 704, the data is loaded into the DRAM or the non-flash NVRAM from flash memory resident on an SoC IC. The SoC IC includes the processor and the flash memory. In one configuration, the non-flash NVRAM is at least one of MRAM, PRAM, RRAM, FeRAM, or NRAM. In one configuration, the first power state is a high power state and the second power state is a low power state.

In one configuration, an apparatus for memory power reduction includes means for determining whether to store data into a DRAM or a NVRAM based on a power consumption by the DRAM in association with refreshing the data in the DRAM and use of the data stored in the DRAM by a processor, based on a power consumption by the NVRAM in association with use of the data stored in the NVRAM by the processor, and based on a duty cycle associated with current drawn in a first power state and a second power state in association with the data. The NVRAM is a type of random-access memory other than flash memory. The apparatus further includes means for storing the data into one of the DRAM or the NVRAM based on the determination whether to store the data in the DRAM or the NVRAM. In one configuration, to determine whether to store the data in the DRAM or the NVRAM, the means for determining is configured to determine, based on the duty cycle, whether the DRAM consumes more power or the NVRAM consumes more power in association with the data; and to determine to store the data into the DRAM when the NVRAM consumes more power than the DRAM in association with the data, and to store the data into the NVRAM when the NVRAM consumes less power than the DRAM in association with the data. In one configuration, the determination whether the DRAM or the NVRAM consumes more power in association with the data is further based on at least one of a determined average current drawn by the DRAM in association with the data or a determined average current drawn by the NVRAM in association with the data. In one configuration, the determination whether the DRAM or the NVRAM consumes more power in association with the data is further based on at least one of a determined first-power-state current drawn by the DRAM during the first power state of the processor in association with the data, a determined second-power-state current drawn by the DRAM during the second power state of the processor in association with the data, the duty cycle associated with current drawn in the first power state and the second power state by the DRAM in association with the data, a determined first-power-state current drawn by the NVRAM during the first power state of the processor in association with the data, a determined second-power-state current drawn by the NVRAM during the second power state of the processor in association with the data, and the duty cycle associated with current drawn in the first power state and the second power state by the NVRAM in association with the data. In one configuration, to determine whether to store the data in the DRAM or the NVRAM, the means for determining is configured to determine a use case for the data; and to access a table associated with use cases to determine whether to store the data in the NVRAM or the DRAM based on the determined use case. In one configuration, the apparatus further includes means for determining that a use case is not included in the table, means for determining whether the use case consumes more or less power in the DRAM or the NVRAM, and means for listing the use case in the table with information indicating whether the DRAM or the NVRAM should be used in association with the use case. In one configuration, the determination whether to store the data in the DRAM or the NVRAM occurs upon an initial booting of the processor. In one configuration, to determine whether to store the data in the DRAM or the NVRAM, the means for determining is configured to store the data into the DRAM, to determine a DRAM power consumption in the DRAM in association with the data, to determine that the processor has been in an idle-standby state with respect to the data for longer than a threshold time period, to move the data from the DRAM to the NVRAM, to determine an NVRAM power consumption in the NVRAM in association with the data, to determine to keep the data stored in the NVRAM when the NVRAM power consumption is less than the DRAM power consumption, and to determine to move the data back to the DRAM when the NVRAM power consumption is greater than the DRAM power consumption. In one configuration, to determine whether to store the data in the DRAM or the NVRAM, the means for determining is configured to determine whether the processor is in an idle-standby state, and to determine to store the data in the NVRAM when the processor is in the idle-standby state and to store the data in the DRAM when the processor is not in the idle-standby state. In one configuration, to determine whether to store the data in the DRAM or the NVRAM, the means for determining is configured to determine whether the processor is processing data in association with a plurality of SIM cards, and to determine to store the data in the DRAM when the processor is determined to be processing data in association with a plurality of SIM cards.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A method of memory power reduction by an apparatus, comprising:
   determining whether to store data into a dynamic random-access memory (DRAM) or a non-volatile random-access memory (NVRAM) based on a power consumption by the DRAM in association with refreshing the data in the DRAM and use of the data stored in the DRAM by a processor, based on a power consumption by the NVRAM in association with use of the data stored in the NVRAM by the processor, and based on a duty cycle associated with current drawn in a first power state and a second power state in association with the data, said NVRAM being a type of random-access memory other than flash memory; and
   storing the data into one of the DRAM or the NVRAM based on the determination whether to store the data in the DRAM or the NVRAM.

2. The method of claim 1, wherein the determination whether to store the data in the DRAM or the NVRAM comprises:
   determining, based on said duty cycle, whether the DRAM consumes more power or the NVRAM consumes more power in association with the data; and
   determining to store the data into the DRAM when the NVRAM consumes more power than the DRAM in association with the data, and to store the data into the NVRAM when the NVRAM consumes less power than the DRAM in association with the data.

3. The method of claim 2, wherein the determination whether the DRAM or the NVRAM consumes more power in association with the data is further based on at least one of a determined average current drawn by the DRAM in association with the data or a determined average current drawn by the NVRAM in association with the data.

4. The method of claim 2, wherein the determination whether the DRAM or the NVRAM consumes more power in association with the data is further based on at least one of a determined first-power-state current drawn by the DRAM during the first power state of the processor in association with the data, a determined second-power-state current drawn by the DRAM during the second power state of the processor in association with the data, said duty cycle associated with current drawn in the first power state and the second power state by the DRAM in association with the data, a determined first-power-state current drawn by the NVRAM during the first power state of the processor in association with the data, a determined second-power-state current drawn by the NVRAM during the second power state of the processor in association with the data, and said duty cycle associated with current drawn in the first power state and the second power state by the NVRAM in association with the data.

5. The method of claim 1, wherein the determination whether to store the data in the DRAM or the NVRAM comprises:
   determining a use case for the data; and
   accessing a table associated with use cases to determine whether to store the data in the NVRAM or the DRAM based on the determined use case.

6. The method of claim 5, further comprising:
   determining that a use case is not included in the table;
   determining whether the use case consumes more or less power in the DRAM or the NVRAM; and
   listing the use case in the table with information indicating whether the DRAM or the NVRAM should be used in association with the use case.

7. The method of claim 5, wherein the determination whether to store the data in the DRAM or the NVRAM occurs upon an initial booting of the processor.

8. The method of claim 1, wherein the determination whether to store the data in the DRAM or the NVRAM comprises:
   storing the data into the DRAM;
   determining a DRAM power consumption in the DRAM in association with the data;
   determining that the processor has been in an idle-standby state with respect to the data for longer than a threshold time period;
   moving the data from the DRAM to the NVRAM;
   determining an NVRAM power consumption in the NVRAM in association with the data;
   determining to keep the data stored in the NVRAM when the NVRAM power consumption is less than the DRAM power consumption; and
   determining to move the data back to the DRAM when the NVRAM power consumption is greater than the DRAM power consumption.

9. The method of claim 1, wherein the determination whether to store the data in the DRAM or the NVRAM comprises:
   determining whether the processor is in an idle-standby state; and
   determining to store the data in the NVRAM when the processor is in the idle-standby state and to store the data in the DRAM when the processor is not in the idle-standby state.

10. The method of claim 1, wherein the determination whether to store the data in the DRAM or the NVRAM comprises:
   determining whether the processor is processing data in association with a plurality of subscriber identity module (SIM) cards; and
   determining to store the data in the DRAM when the processor is determined to be processing data in association with a plurality of SIM cards.

11. The method of claim 1, wherein the data is loaded into the DRAM or the NVRAM from flash memory resident on a system on a chip (SoC) integrated circuit (IC), the SoC IC including the processor and the flash memory.

12. The method of claim 1, wherein the NVRAM comprises at least one of magnetoresistive random-access memory (MRAM), phase-change random-access memory (PRAM), resistive random-access memory (RRAM), ferroelectric random-access memory (FeRAM), or nano-random-access memory (NRAM).

13. The method of claim 1, wherein the first power state is a high power state and the second power state is a low power state.

14. The method of claim 1, further comprising accessing the stored data periodically from one of the DRAM or the NVRAM during the first power state associated with the duty cycle.

15. An apparatus for memory power reduction, comprising:
   means for determining whether to store data into a dynamic random-access memory (DRAM) or a non-volatile random-access memory (NVRAM) based on a power consumption by the DRAM in association with refreshing the data in the DRAM and use of the data stored in the DRAM by a processor, based on a power consumption by the NVRAM in association with use of the data stored in the NVRAM by the processor, and based on a duty cycle associated with current drawn in a first power state and a second power state in association with the data, said NVRAM being a type of random-access memory other than flash memory; and
   means for storing the data into one of the DRAM or the NVRAM based on the determination whether to store the data in the DRAM or the NVRAM.

16. The apparatus of claim 15, wherein to determine whether to store the data in the DRAM or the NVRAM, the means for determining is configured to:
   determine, based on said duty cycle, whether the DRAM consumes more power or the NVRAM consumes more power in association with the data; and
   determine to store the data into the DRAM when the NVRAM consumes more power than the DRAM in association with the data, and to store the data into the NVRAM when the NVRAM consumes less power than the DRAM in association with the data.

17. The apparatus of claim 16, wherein the determination whether the DRAM or the NVRAM consumes more power in association with the data is further based on at least one of a determined average current drawn by the DRAM in association with the data or a determined average current drawn by the NVRAM in association with the data.

18. The apparatus of claim 16, wherein the determination whether the DRAM or the NVRAM consumes more power in association with the data is further based on at least one of a determined first-power-state current drawn by the DRAM during the first power state of the processor in association with the data, a determined second-power-state current drawn by the DRAM during the second power state of the processor in association with the data, said duty cycle associated with current drawn in the first power state and the second power state by the DRAM in association with the data, a determined first-power-state current drawn by the NVRAM during the first power state of the processor in association with the data, a determined second-power-state current drawn by the NVRAM during the second power state of the processor in association with the data, and said duty cycle associated with current drawn in the first power state and the second power state by the NVRAM in association with the data.

19. The apparatus of claim 15, wherein to determine whether to store the data in the DRAM or the NVRAM, the means for determining is configured to:
   determine a use case for the data; and
   access a table associated with use cases to determine whether to store the data in the NVRAM or the DRAM based on the determined use case.

20. The apparatus of claim 19, further comprising:
   means for determining that a use case is not included in the table;
   means for determining whether the use case consumes more or less power in the DRAM or the NVRAM; and
   means for listing the use case in the table with information indicating whether the DRAM or the NVRAM should be used in association with the use case.

21. The apparatus of claim 19, wherein the determination whether to store the data in the DRAM or the NVRAM occurs upon an initial booting of the processor.

22. The apparatus of claim 15, wherein to determine whether to store the data in the DRAM or the NVRAM, the means for determining is configured to:
   store the data into the DRAM;
   determine a DRAM power consumption in the DRAM in association with the data;
   determine that the processor has been in an idle-standby state with respect to the data for longer than a threshold time period;
   move the data from the DRAM to the NVRAM;
   determine an NVRAM power consumption in the NVRAM in association with the data;
   determine to keep the data stored in the NVRAM when the NVRAM power consumption is less than the DRAM power consumption; and
   determine to move the data back to the DRAM when the NVRAM power consumption is greater than the DRAM power consumption.

23. The apparatus of claim 15, wherein to determine whether to store the data in the DRAM or the NVRAM, the means for determining is configured to:
   determine whether the processor is in an idle-standby state; and
   determine to store the data in the NVRAM when the processor is in the idle-standby state and to store the data in the DRAM when the processor is not in the idle-standby state.

24. The apparatus of claim 15, wherein to determine whether to store the data in the DRAM or the NVRAM, the means for determining is configured to:
  determine whether the processor is processing data in association with a plurality of subscriber identity module (SIM) cards; and
  determine to store the data in the DRAM when the processor is determined to be processing data in association with a plurality of SIM cards.

25. The apparatus of claim 15, wherein the data is loaded into the DRAM or the NVRAM from flash memory resident on a system on a chip (SoC) integrated circuit (IC), the SoC IC including the processor and the flash memory.

26. The apparatus of claim 15, wherein the NVRAM comprises at least one of magnetoresistive random-access memory (MRAM), phase-change random-access memory (PRAM), resistive random-access memory (RRAM), ferroelectric random-access memory (FeRAM), or nano-random-access memory (NRAM).

27. The apparatus of claim 15, wherein the first power state is a high power state and the second power state is a low power state.

28. The apparatus of claim 15, further comprising means for accessing the stored data periodically from one of the DRAM or the NVRAM during the first power state associated with the duty cycle.

29. An apparatus for memory power reduction, comprising:
  a memory; and
  at least one processor coupled to the memory and configured to:
  determine whether to store data into a dynamic random-access memory (DRAM) or a non-volatile random-access memory (NVRAM) based on a power consumption by the DRAM in association with refreshing the data in the DRAM and use of the data stored in the DRAM by a processor, based on a power consumption by the NVRAM in association with use of the data stored in the NVRAM by the processor, and based on a duty cycle associated with current drawn in a first power state and a second power state in association with the data, said NVRAM being a type of random-access memory other than flash memory; and
  store the data into one of the DRAM or the NVRAM based on the determination whether to store the data in the DRAM or the NVRAM.

30. The apparatus of claim 29, wherein to determine whether to store the data in the DRAM or the NVRAM, the at least one processor is configured to:
  determine, based on said duty cycle, whether the DRAM consumes more power or the NVRAM consumes more power in association with the data; and
  determine to store the data into the DRAM when the NVRAM consumes more power than the DRAM in association with the data, and to store the data into the NVRAM when the NVRAM consumes less power than the DRAM in association with the data.

31. The apparatus of claim 30, wherein the determination whether the DRAM or the NVRAM consumes more power in association with the data is further based on at least one of a determined average current drawn by the DRAM in association with the data or a determined average current drawn by the NVRAM in association with the data.

32. The apparatus of claim 30, wherein the determination whether the DRAM or the NVRAM consumes more power in association with the data is further based on at least one of a determined first-power-state current drawn by the DRAM during the first power state of the processor in association with the data, a determined second-power-state current drawn by the DRAM during the second power state of the processor in association with the data, said duty cycle associated with current drawn in the first power state and the second power state by the DRAM in association with the data, a determined first-power-state current drawn by the NVRAM during the first power state of the processor in association with the data, a determined second-power-state current drawn by the NVRAM during the second power state of the processor in association with the data, and said duty cycle associated with current drawn in the first power state and the second power state by the NVRAM in association with the data.

33. The apparatus of claim 29, wherein to determine whether to store the data in the DRAM or the NVRAM, the at least one processor is configured to:
  determine a use case for the data; and
  access a table associated with use cases to determine whether to store the data in the NVRAM or the DRAM based on the determined use case.

34. The apparatus of claim 33, wherein the at least one processor is further configured to:
  determine that a use case is not included in the table;
  determine whether the use case consumes more or less power in the DRAM or the NVRAM; and
  list the use case in the table with information indicating whether the DRAM or the NVRAM should be used in association with the use case.

35. The apparatus of claim 33, wherein the determination whether to store the data in the DRAM or the NVRAM occurs upon an initial booting of the processor.

36. The apparatus of claim 29, wherein to determine whether to store the data in the DRAM or the NVRAM, the at least one processor is configured to:
  store the data into the DRAM;
  determine a DRAM power consumption in the DRAM in association with the data;
  determine that the processor has been in an idle-standby state with respect to the data for longer than a threshold time period;
  move the data from the DRAM to the NVRAM;
  determine an NVRAM power consumption in the NVRAM in association with the data;
  determine to keep the data stored in the NVRAM when the NVRAM power consumption is less than the DRAM power consumption; and
  determine to move the data back to the DRAM when the NVRAM power consumption is greater than the DRAM power consumption.

37. The apparatus of claim 29, wherein to determine whether to store the data in the DRAM or the NVRAM, the at least one processor is configured to:
  determine whether the processor is in an idle-standby state; and
  determine to store the data in the NVRAM when the processor is in the idle-standby state and to store the data in the DRAM when the processor is not in the idle-standby state.

38. The apparatus of claim 29, wherein to determine whether to store the data in the DRAM or the NVRAM, the at least one processor is configured to:
  determine whether the processor is processing data in association with a plurality of subscriber identity module (SIM) cards; and determine to store the data in the DRAM when the processor is determined to be processing data in association with a plurality of SIM cards.

39. The apparatus of claim 29, wherein the data is loaded into the DRAM or the NVRAM from flash memory resident on a system on a chip (SoC) integrated circuit (IC), the SoC IC including the processor and the flash memory.

40. The apparatus of claim 29, wherein the NVRAM comprises at least one of magnetoresistive random-access memory (MRAM), phase-change random-access memory (PRAM), resistive random-access memory (RRAM), ferro-electric random-access memory (FeRAM), or nano-random-access memory (NRAM).

41. The apparatus of claim 29, wherein the first power state is a high power state and the second power state is a low power state.

42. The apparatus of claim 29, wherein the at least one processor is further configured to access the stored data periodically from one of the DRAM or the NVRAM during the first power state associated with the duty cycle.

43. A non-transitory computer-readable medium storing computer executable code for memory power reduction, comprising code for:

determining whether to store data into a dynamic random-access memory (DRAM) or a non-volatile random-access memory (NVRAM) based on a power consumption by the DRAM in association with refreshing the data in the DRAM and use of the data stored in the DRAM by a processor, based on a power consumption by the NVRAM in association with use of the data stored in the NVRAM by the processor, and based on a duty cycle associated with current drawn in a first power state and a second power state in association with the data, said NVRAM being a type of random-access memory other than flash memory; and storing the data into one of the DRAM or the NVRAM based on the determination whether to store the data in the DRAM or the NVRAM.

* * * * *